(12) United States Patent
Horikawa (10) Patent No.: US 9,032,904 B2
(45) Date of Patent: May 19, 2015

(54) DIE HEAD AND LIQUID COATER

(75) Inventor: Akihiro Horikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 519 days.

(21) Appl. No.: 12/881,546

(22) Filed: Sep. 14, 2010

(65) Prior Publication Data

US 2011/0073035 A1 Mar. 31, 2011

(30) Foreign Application Priority Data

Sep. 28, 2009 (JP) ................................. 2009-222224
Aug. 9, 2010 (JP) ................................. 2010-178902

(51) Int. Cl.
 *B05C 5/02* (2006.01)
 *B05C 11/10* (2006.01)
 *H01L 21/67* (2006.01)

(52) U.S. Cl.
 CPC ........... *B05C 11/1039* (2013.01); *B05C 5/0245* (2013.01); *B05C 5/0254* (2013.01); *B05C 5/027* (2013.01); *H01L 21/6715* (2013.01)

(58) Field of Classification Search
 CPC ........ B05C 5/0254; B05C 5/027; B05C 5/02; B05C 5/0204; B05C 5/0245; B05C 11/1039; H01L 21/6715
 USPC ......... 118/410, 429, 62, 63, DIG. 4; 427/420, 427/421.1
 See application file for complete search history.

(56) References Cited

U.S. PATENT DOCUMENTS

| 3,196,832 | A | * | 7/1965 | Zin ................................ 399/103 |
| 4,842,900 | A | | 6/1989 | Miyamoto |
| 5,183,508 | A | * | 2/1993 | Cholinski ...................... 118/683 |
| 6,524,388 | B1 | * | 2/2003 | Yamada et al. ............... 118/663 |
| 8,117,985 | B2 | * | 2/2012 | Whitfield ...................... 118/641 |

FOREIGN PATENT DOCUMENTS

| CN | 1184015 | 1/2005 |
| JP | 48-32923 | 5/1973 |
| JP | 62-186966 | 8/1987 |
| JP | 9-141170 | 6/1997 |
| JP | 2001-300386 | 10/2001 |
| JP | 2003-53233 | 2/2003 |
| JP | 2003-053233 | 2/2003 |
| JP | 2005-270704 | 10/2005 |
| JP | 2008-149223 | 7/2008 |
| WO | 95/29763 | 11/1995 |

* cited by examiner

*Primary Examiner* — Laura Edwards
(74) *Attorney, Agent, or Firm* — Greenblum & Bernstein, P.L.C.

(57) ABSTRACT

A die head is disclosed comprises: a feed slot which is positioned downstream of the moving direction of the substrate and continuously feed the coating solution; a gas suction slot which is positioned upstream of the moving direction of the substrate and suctions a gas so as to create vacuum in the vicinity of the upstream edge of the bead with respect to the moving direction of the substrate; and a gas ejection slot which is positioned between the feed slot and gas suction slot and ejects a gas so as to prevent inflow of the coating solution into the gas suction slot.

6 Claims, 10 Drawing Sheets

DIE HEAD AND LIQUID COATER

CROSS REFERENCE TO RELATED APPLICATIONS

This application is entitled and claims the benefit of Japanese Patent Application No. 2009-222224, filed on Sep. 28, 2009, and Japanese Patent Application No. 2010-178902, filed on Aug. 9, 2010, the disclosures of which including the specification, drawings and abstract are incorporated herein by reference in its entirety.

TECHNICAL FIELD

This disclosure relates a die head for applying a liquid such as ink onto a predetermined position of a substrate to be coated, and a liquid coater having the die head.

Liquid coaters that include an extrusion-type head called "die head" have been widely used in many fields for their capability of forming coatings of uniform thickness.

The die head typically includes a manifold which evenly distributes a coating solution, fed from a coating solution tank, across the width of a coating film to be deposited, and a feed slot for discharging the distributed coating solution. The feed slot may be provided in the form of multiple through holes (see FIGS. 9B to 9D and FIGS. 10A to 10C). This configuration enables the coating film solution to be applied in stripes.

When such a die head is used to apply a coating solution onto a substrate, the coating solution is fed into a gap formed between the tip portion of the die head and the substrate (hereinafter also simply referred to as a "coating gap") to form a bead of coating solution, and then the substrate is relatively moved with respect to the die head while ensuring that the bead is retained in the coating gap. In this way, a coating film formed from the coating solution is deposited on the substrate.

It is critical during such a slot die coating process to retain a stable bead of coating solution because unstable bead reduces uniformity in the width or thickness of the coating film deposited onto the substrate or causes discontinuity in the coating, and thus high-precision coating becomes difficult. The bead tends to become unstable particularly where a high shearing force is applied to the bead due to the increased relative moving speed of the substrate with respect to the die head or where the coating gap is so widened as to avoid possible physical contact between the die head and substrate. As used herein, "bead becomes unstable" and equivalent expressions mean a state where bead shape becomes unstable or a bead becomes more likely to come off the substrate. Hereinafter, a phenomenon that a bead comes off a substrate will also be expressed as "bead breaks up".

Generally known strategies for avoiding unstabilization of a bead due to a high shearing force involve providing a gas suction chamber or slot at a position upstream of a slot for discharging a coating solution (hereinafter referred to as "feed slot") with respect to the direction in which the substrate relatively moves with respect to the die head (hereinafter also simply referred to as "moving direction") and creating vacuum in the vicinity of the upstream edge of the bead with respect to the moving direction (hereinafter also simply referred to "upstream edge of the bead") by means of the gas suction chamber or slot (see Patent Document 1).

Figure 1A:
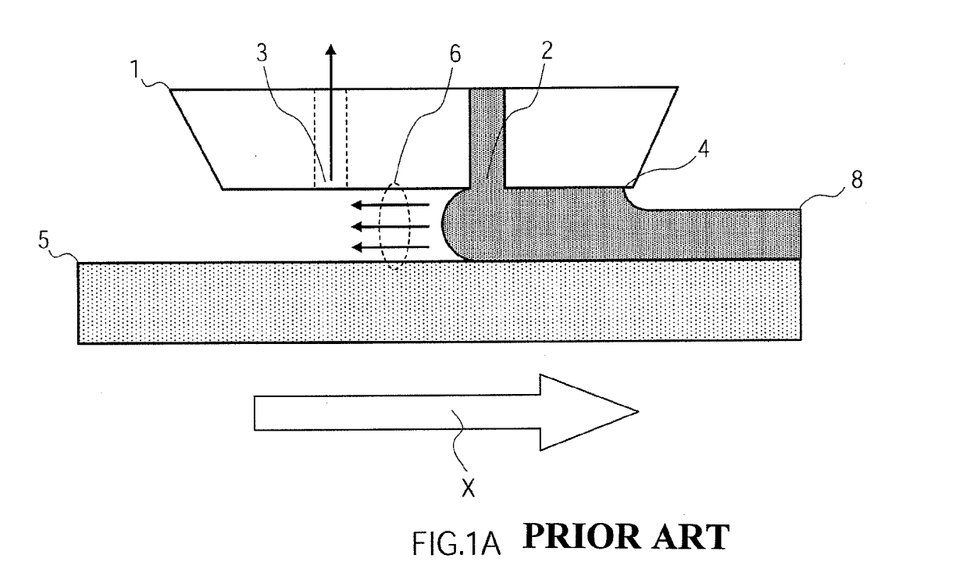
FIGS. 1A and 1B illustrate how vacuum is created in the vicinity of the upstream side of a bead by use of a conventional die head.

FIG. 1A is a cross-sectional view of the die head disclosed by Patent Document 1. As illustrated in FIG. 1A, die head 1 includes in its tip portion feed slot 2 for discharging a coating solution and gas suction slot 3 for suctioning a gas.

Gas suction slot 3 suctions a gas in the coating gap to create vacuum in vicinity 6 upstream edge of bead 4, whereby the upstream edge of bead 4 can be pulled upstream of direction X, a relative moving direction of substrate 5. This prevents unstabilization of the bead which is caused by the shearing force that results from the relative movement of substrate 5.

Figure 1B:
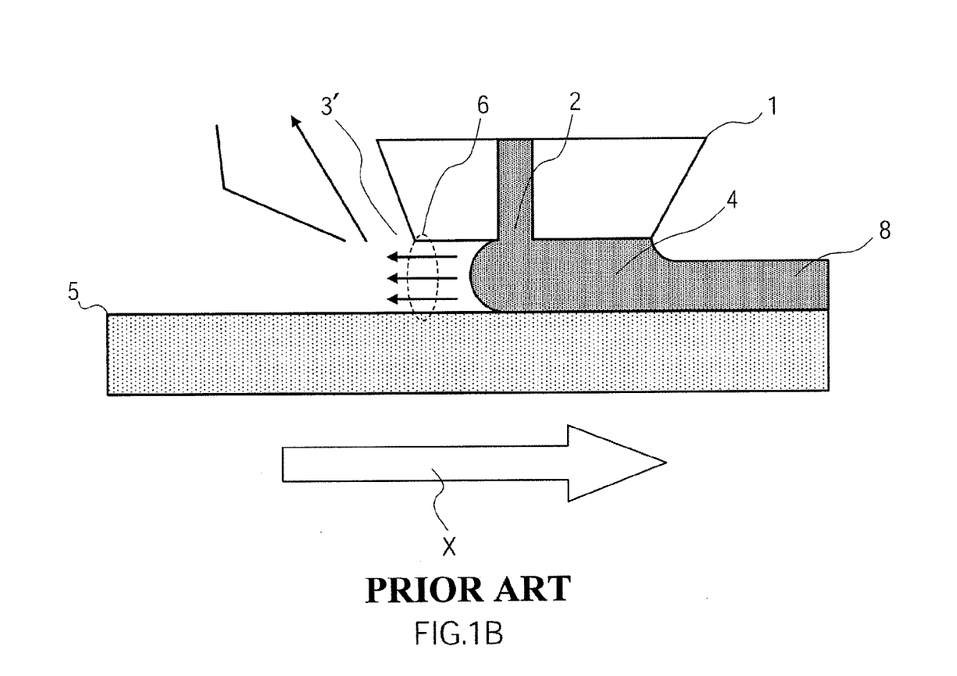

In another bead vacuum technology, gas suction chamber 3' is disposed upstream of the feed slot with respect to the moving direction in stead of gas suction slot 3, as illustrated in FIG. 1B.

Moreover, technologies are known in which a gas flow is blown over the surface of the substrate toward the direction opposite to the moving direction of the substrate so as to avoid the generation of air entrainment on the surface of the moving substrate (see, e.g., Patent Documents 2-5).

CITATION LIST

Patent Literature

Patent Document 1: Japanese Patent Application No. 2003-053233
Patent Document 2: Japanese Patent Application No. 9-141170
Patent Document 3: Japanese Patent Application No. 62-186966
Patent Document 4: Japanese Patent Application No. 48-32923
Patent Document 5: U.S. Pat. No. 4,842,900

SUMMARY OF INVENTION

Technical Problem

Creating vacuum in the vicinity 6 of the upstream edge of bead 4 as disclosed by Patent Document 1, however, has a drawback that bead 4 is sometimes pulled to an extent that the coating solution reaches and flows into gas suction slot 3.

Figure 2A:
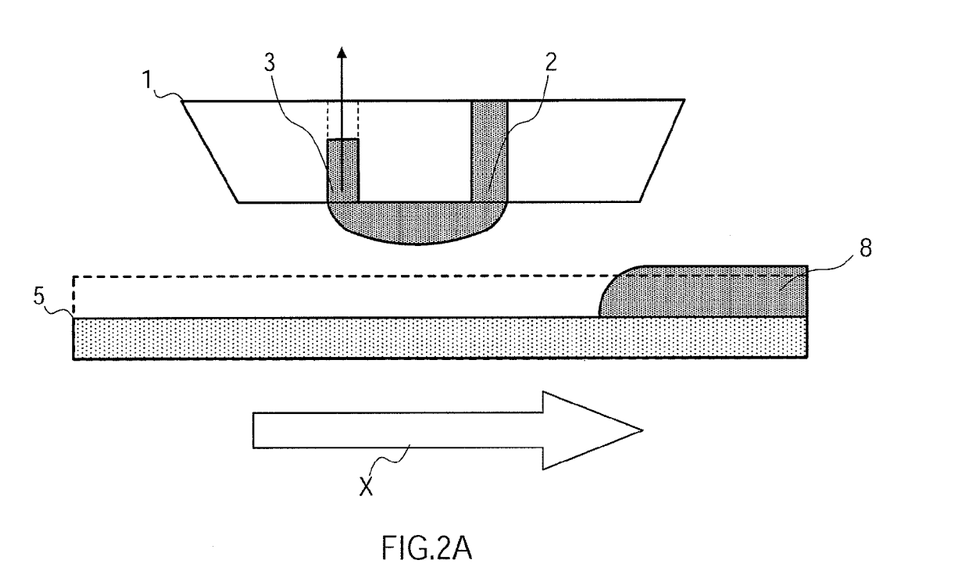
FIGS. 2A and 2B illustrate a state where a coating solution has been suctioned into a gas suction slot or chamber.
Figure 2B:
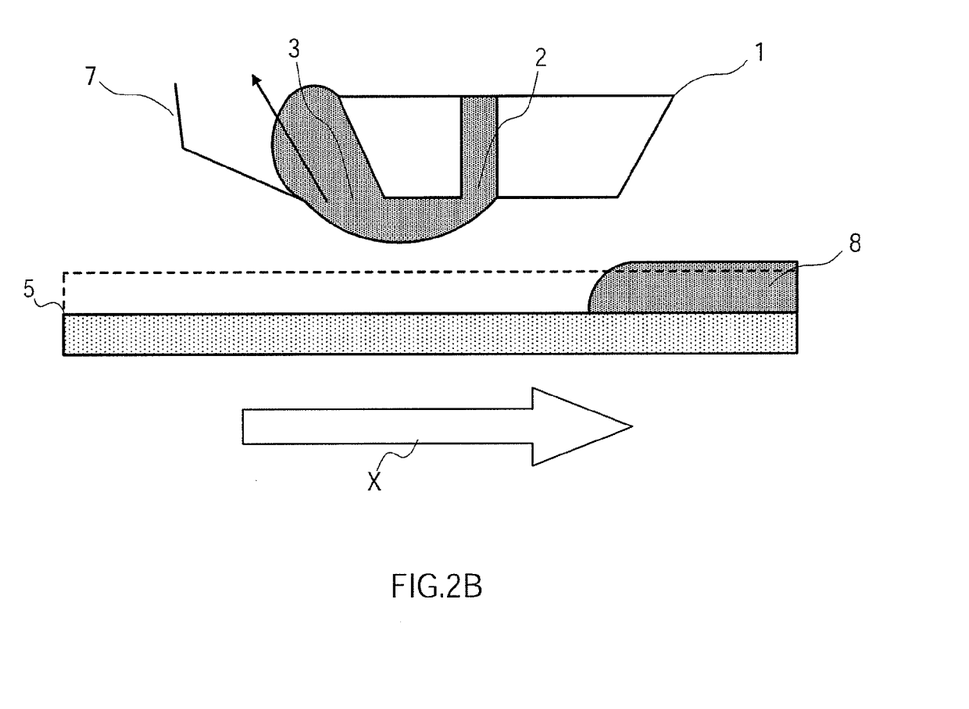

Furthermore, if the size of the coating gap fluctuates during coating due to non-uniform thickness across the substrate or due to vibrations of the die head to cause breakup of bead 4, the coating solution undesirably flows into gas suction slot 3 or gas suction chamber 3' (see FIGS. 2A and 2B). In particular, when the coating solution is applied in stripes, the beads are so small in size that they exhibit low stability and therefore are prone to breakup. Accordingly, for stripe coating, coating solution is more likely to flow into the gas suction slot.

When the coating solution has entered the gas suction slot it prevents gas flow therein. Thus, the gas suction slot cannot perform a stable gas suction operation. This causes fluctuations in the air pressure in the vicinity of the upstream edge of the bead and makes the bead unstable, thereby reducing uniformity in the width or thickness of a coating film to be deposited onto a substrate or causing discontinuity in the coating.

For the reasons described above, in conventional liquid coaters such as that disclosed by Patent Document 1, the flow amount of a gas to be suctioned by the gas suction slot needs to be reduced to a level that prevents inflow of coating solution into the gas suction slot. Thus, the conventional liquid coaters cannot avoid unstabilization of bead when the shearing force that results from relative movement of the substrate has increased; therefore, there have been limitations in increasing the coating speed.

Moreover, the conventional liquid coaters as disclosed by Patent Document 1 cannot preclude the problem of bead unstabilility that occurs when the coating gap is widened.

An object of the present invention is therefore to provide a die head that can retain a stable bead of coating solution and thus enables rapid, high-precision coating process.

Solution to Problem

The inventors found that it is possible to prevent inflow of coating solution into a gas suction slot by providing a gas ejection slot between a feed slot and a gas suction slot. The inventors conducted additional studies to complete the present invention. A first aspect of the present invention relates to die heads given below.

A die head is provided with a tip portion for continuously discharging a coating solution to form a coating film on a substrate by retaining a bead of the coating solution in a gap formed between the tip portion and the substrate relatively moving with respect to the die head in a predetermined direction. The tip portion is provided with a feed slot which is positioned downstream of the moving direction of the substrate and continuously feed the coating solution, a gas suction slot which is positioned upstream of the moving direction of the substrate and suctions a gas so as to create vacuum in the vicinity of a upstream edge of the bead with respect to the moving direction of the substrate, and a gas ejection slot which is positioned between the feed slot and the gas suction slot and ejects a gas so as to prevent inflow of the coating solution into the gas suction slot. A direction in which the gas ejection slot ejects the gas is not inclined with respect to a surface of the substrate toward the upstream of the moving direction of the substrate.

In the die head, the distance between the feed slot and the gas ejection slot is 0.3 mm or more, and the distance between the gas ejection slot and the gas suction slot is 0.05-15 mm.

In the die head, the flow amount of a gas ejected from the gas ejection slot is smaller than the flow amount of a gas suctioned by the gas suction slot.

In the die head, the direction in which the gas ejection slot ejects the gas is perpendicular to the surface of the substrate.

In the die head, the direction in which the gas ejection slot ejects the gas is inclined with respect to the surface of the substrate toward the downstream of the moving direction of the substrate.

In the die head, an inclination angle of the direction in which the gas ejection slot ejects the gas with respect to a normal of the substrate surface is 1-75°.

In the die head, a region of the tip portion between the gas suction slot and gas ejection slot is smaller in height than the other regions of the tip portion.

A second aspect of the present invention relates a liquid coater given below. A liquid coater is provided with the die head.

Advantageous Effects of Invention

According to the present invention, a gas ejected from a gas ejection slot prevents inflow coating solution into a gas suction slot even when the upstream edge of a bead is strongly suctioned. Moreover, according to the present invention, the bead is kept pressed against the substrate by the gas ejected from the gas ejection slot, whereby the bead remains stable and thus rapid, high-precision coating is made possible.

DESCRIPTION OF EMBODIMENTS

1. Die Head

A die head according to the invention includes a tip portion which continuously discharges coating solution. The die head retains during a coating process a bead of coating solution in a gap formed between the tip portion and a substrate to be coated, which substrate relatively moves in a predetermined direction with respect to the die head (hereinafter also simply referred to as "moving direction"), so that a coating film is deposited on the substrate.

The die head includes a distribution manifold that is connected to a feed slot and evenly distributes a coating solution across the width of a coating film to be deposited. The die head is characterized in its tip portion configuration. The tip portion configuration of the die head will be described below.

The die head includes in its tip portion a feed slot which is positioned downstream of the moving direction; a gas suction slot which is positioned upstream of the moving direction; and a gas ejection slot which is positioned between the feed slot and gas suction slot. As used herein, the term "slot" means a groove-like hole or slit (see FIGS. 9A to 10C). The present invention is characterized in that a gas ejection slot is provided between a feed slot and a gas suction slot.

Each slot may or may not be provided in the form of multiple holes (see FIGS. 9A to 10C). The functions of the respective slots will be described below.

The feed slot is connected to the distribution manifold and continuously discharges coating solution. During a coating process the coating solution discharged forms a bead in a gap (coating gap) formed between the tip portion of the die head and substrate.

The gas suction slot is connected to a vacuum pump or the like and suctions a gas. During a coating process the gas suction slot suctions a gas so as to create vacuum in the vicinity of the upstream side of the bead with respect to the moving direction. There are no particular limitations to the distance between the feed slot and gas suction slot; however, it is preferably 0.43-20 mm.

If the distance between the feed slot and gas suction slot is greater than 20 mm, there arise a fear that it results in failure to create vacuum in the vicinity of the upstream side of the bead even when the gas suction slot suctions gas. If the distance is less than 0.43 mm, on the other hand, there arises a fear that the coating solution forming the bead flows into the gas suction slot.

The direction in which the gas suction slot suctions gas (hereinafter also simply referred to as "suction direction") may be perpendicular with respect to the surface of the substrate. In some cases, the suction direction may be inclined with respect to the substrate surface toward the upstream or downstream of the moving direction.

Inclining the suction direction toward the upstream of the moving direction increases the efficiency to suction the upstream edge of the bead, enabling the bead to be suctioned with a small amount of gas. Thus, even when the coating gap is widened and thus the bead size increased, the upstream edge of the bead can be suctioned by a strong force, thereby avoiding unstabilization of the bead. On the other hand, inclining the suction direction toward the downstream of the moving direction increases the efficiency to suction the surface of the non-coated substrate, whereby the substrate can be cleaned as foreign substances or dusts attached to the surface of the raw substrate can be efficiently removed.

The gas ejection slot is connected to a compressor or the like and ejects a gas. The gas ejection slot ejects a gas so as to prevent inflow of the coating solution into the gas suction slot. The flow amount and flow rate of the gas ejected from the gas ejection slot vary depending on the discharge amount of the coating solution, moving speed of the substrate, die head size, the distance between the die head and substrate, etc. For example, when the flow amount of the solution from the feed slot is 0.0054-2 ml/min, the flow amount and flow rate of the gas from the gas ejection slot are preferably 3 ml/min or higher and 0.6 m/min or higher, respectively, and more preferably 5 ml/ml or higher and 1 m/min or higher, respectively. If the flow amount of the gas from the gas ejection slot is less than 3 ml/min and the flow rate is less than 0.6 m/min, inflow of coating solution into the gas suction slot cannot be prevented.

There are no particular limitations to the distance between the gas ejection slot and feed slot; however, it is preferably 0.3 mm or larger. A distance of less than 0.3 mm raises a fear that the gas ejected from the gas ejection slot flows between the bead and substrate thereby making the bead unstable.

The direction in which the gas ejection slot ejects a gas (hereinafter also simply referred to as "ejection direction") may be perpendicular with respect to the surface of the substrate. The ejection direction is preferably inclined with respect to the substrate surface toward the downstream of the moving direction (see embodiment 2, and FIG. 5). This configuration prevents the gas which has been ejected from the gas ejection slot from flowing between the bead and substrate and thus avoids unstabilization of the bead. It is not preferable to incline the ejection direction toward the upstream of the moving direction because this causes the gas ejected from the gas ejection slot to flow between the bead and substrate and make the bead unstable (see FIG. 6).

The number of the gas suction slot provided in the tip portion of the die head may be the same as or different from the number of the gas ejection slot. For example, when the gas suction slot outnumbers the gas ejection slot, it is possible to prevent the gas ejected from the gas ejection slots from flowing between the bead and substrate (see embodiment 4).

The flow amount of the gas ejected from the gas ejection slot is preferably smaller than the flow amount of the gas suctioned by the gas suction slot. Specifically, the flow amount of the gas ejected from the gas ejection slot is preferably 0.005 to 0.95 times the flow amount of the gas suctioned by the gas suction slot. More specifically, the flow amount of the gas ejected from the gas ejection slot is preferably smaller than the flow amount of the gas suction by the gas suction slot by 5-995 ml/min. When the amount of a gas to be ejected is much larger than the amount of a gas to be suctioned, vacuum cannot be created in the vicinity of the upstream edge of the bead. This also facilitates unwanted inflow of some of the ejected gas between the bead and substrate, raising a fear that the bead becomes unstable.

The gas ejected from the gas ejection slot flows between the tip portion of a die head and a substrate toward the upstream of the moving direction, and eventually flows into the gas suction slot.

In this way it is possible to prevent inflow of coating solution into the gas suction slot by means of a gas ejected from the gas ejection slot, even when the upstream edge of a bead is suctioned toward the upstream of the moving direction. It is thus possible to suction the upstream edge of the bead toward the upstream of the moving direction by a strong force, preventing unstabilization of the bead even when a high shearing force is applied to the bead. Accordingly, a stable bead can be retained even when the shearing force has risen due to the increased relative moving speed of the substrate. It is thus possible to form a uniform coating even when the coating speed is increased. It is also possible to form a thinner coating since the relative moving speed of the substrate can be increased.

By ejection a gas from the gas ejection slot, the bead can be kept pressed against the substrate. This prevents unstabilization of bead that occurs when large coating gap is employed. Thus, according to the present invention, the coating gap can be widened 10 to 20 times the thickness of a coating to be deposited, for example. This avoids possible physical contact between the die head and substrate and makes formation of a uniform coating possible. If the die head and substrate contact each other, it results in non-uniform coating thickness or discontinuity in the coating, for example.

As described above, the gas ejected from the gas ejection slot flows between the tip portion of the die head and substrate toward the upstream of the moving direction. This gas can clean the substrate to be coated, by removing foreign substances present thereon.

Furthermore, there is no need in the present invention to clean the inside of the gas suction slot since there are no incidents of inflow of coating solution. This makes it possible to conduct another coating process immediately after cleaning the tip portion of the die head, thereby attaining high productivity.

The effects of ejecting a gas from the gas ejection slot will be detailed in embodiment 1 with reference to the drawings.

2. Liquid Coater

A liquid coater according to an embodiment is characterized in that it includes the die head described above. The liquid coater appropriately includes other known liquid coater units.

For example, the liquid coater includes, in addition to the die head, a coating solution tank which stores a coating solution to be fed to the die head; a feed pump for feeding a coating solution to the die head; a vacuum pump which suctions a gas; a compressor which feeds a gas; members for immobilizing the die head; and a transfer stage for transferring a substrate to be coated.

With reference to the drawings, embodiments will be described below, which however shall not be construed as limiting the scope of the invention thereto.

Embodiment 1

Figure 3A:
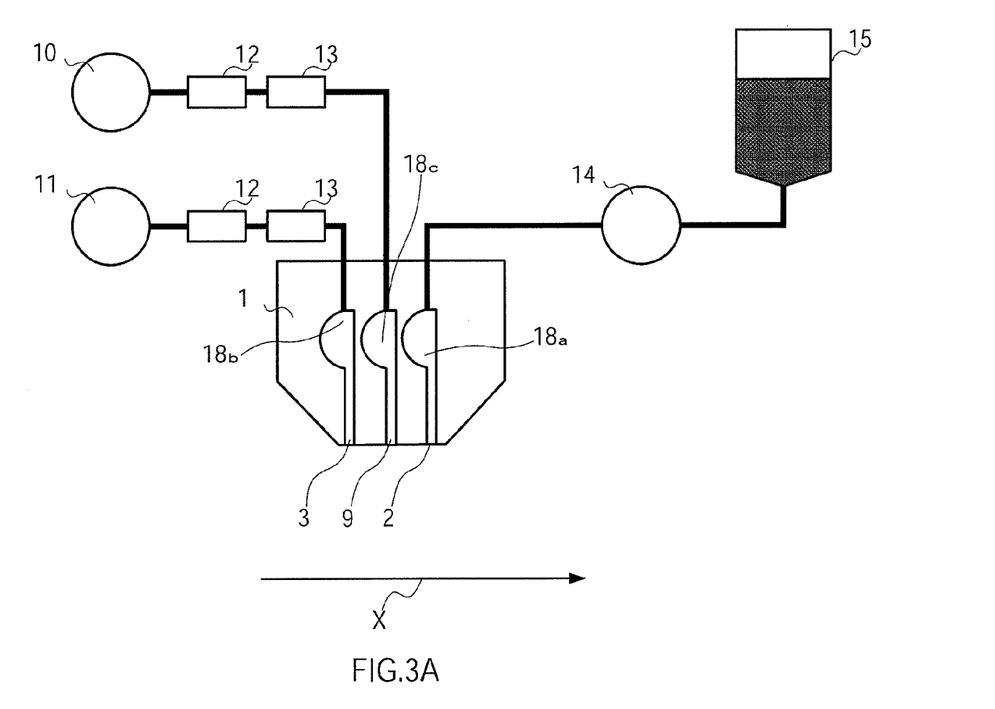
FIGS. 3A and 3B are schematic diagrams of a liquid coater including a die head according to embodiment 1.

FIG. 3A is a schematic diagram of a liquid coater which includes a die head according to embodiment 1. As illustrated in FIG. 3A, the liquid coater according to embodiment 1 include die head 1, compressor 10, vacuum pump 11, flow control valve 12, flow meter 13, feed pump 14, and coating solution tank 15.

Die head 1 includes in the tip portion feed slot 2, gas suction slot 3, and gas ejection slot 9. Die head 1 further includes distribution manifold 18a connected to feed slot 2; suction manifold 18b connected to gas suction slot 3; and ejection manifold 18c connected to gas ejection slot 9.

Compressor 10 feeds a gas to gas ejection slot 9. Vacuum pump 11 suctions a gas through gas suction slot 3. The flow amount of the gas to be suctioned or fed is observed with flow meter 13 and is controlled by flow control valve 12.

Coating solution tank 15 stores therein a coating solution. The coating solution stored in coating solution tank 15 is fed to die head 1 by feed pump 14, a pump which is capable of stable fluid feeding like a metering pump.

Figure 3B:
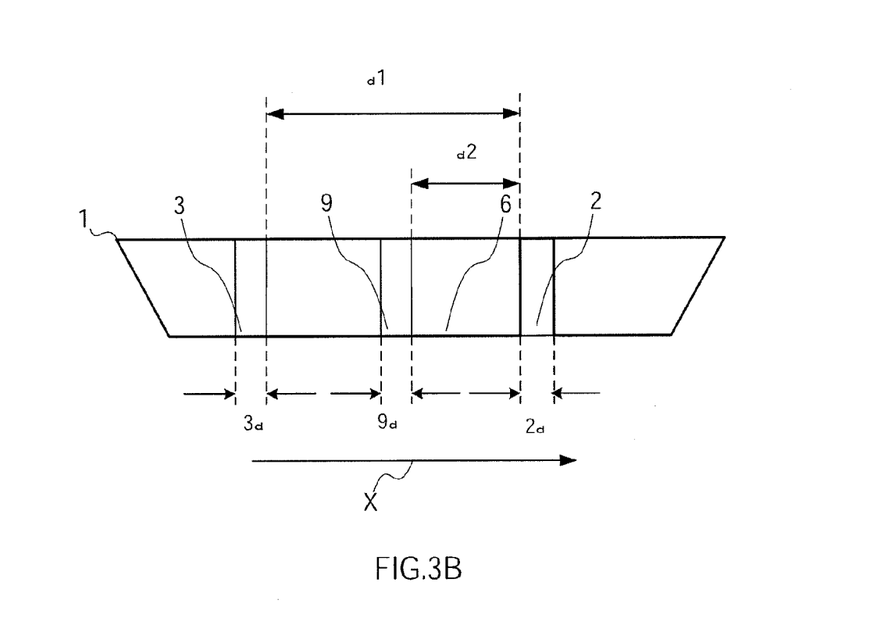

FIG. 3B is an enlarged diagram of the tip portion of die head 1 illustrated in FIG. 3A. As illustrated in FIG. 3B, die head 1 includes in the tip portion: feed slot 2 which is positioned upstream of the relative moving direction X of a substrate (hereinafter also simply referred to as "moving direction X") to be described later; gas suction slot 3 which is positioned downstream of moving direction X; and gas ejection slot 9 which is positioned between feed slot 2 and gas suction slot 3.

Distance d1 between feed slot 2 and gas suction slot 3 is 0.43-20 mm, and distance d2 between feed slot 2 and gas ejection slot 9 is 0.3 mm or more.

Width 2d of feed slot 2 is 30-1,000 μm, width 3d of gas suction slot 3 is 30-1,000 μm, and width 9d of gas ejection slot 9 is 30-1,004 μm, With reference to FIGS. 4A and 4B, a method of applying a coating solution onto a substrate by use of die head 1 according embodiment 1 will be described.

Figure 4A:
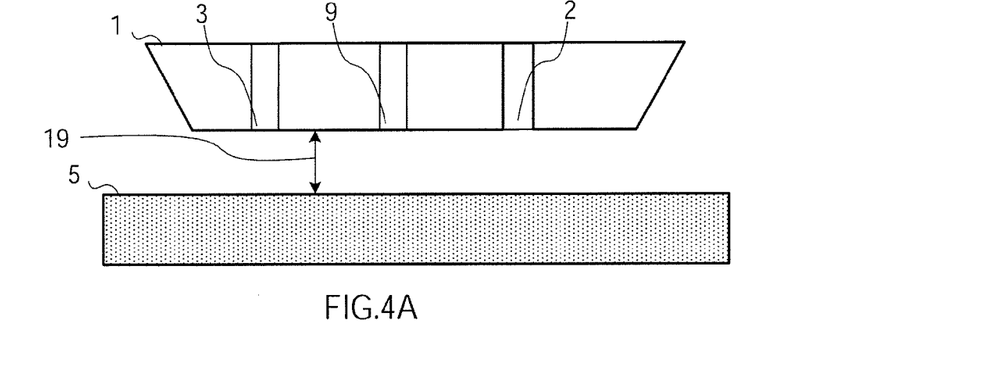
FIGS. 4A to 4C illustrate how a substrate is coated by use of a die head according to embodiment 1.

As illustrated in FIG. 4A, die head 1 is first placed above substrate 5. Die head 1 and substrate 5 are separated from each other. Coating gap 19 between the tip portion of die head 1 and substrate 5 is 0.03-0.5 mm.

Figure 4B:
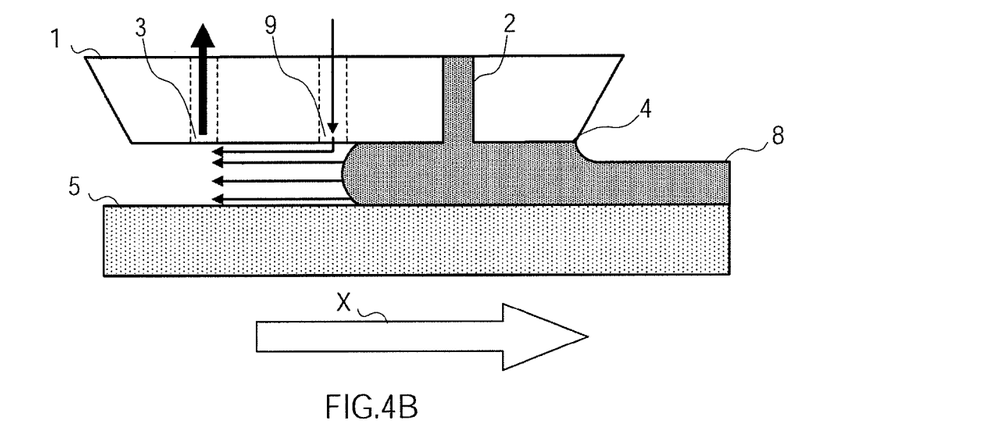

As illustrated in FIG. 4B, substrate 5 is then relatively moved with respect to die head 1 in direction X (moving direction). To achieve relative movement of substrate 5 with respect to die head 1, substrate 5 or die head 1, or both may be moved.

Coating film 8 is formed on substrate 5 by discharging a coating solution through feed slot 2 so as to form and retain bead 4 in coating gap 19 formed between the tip portion of die head 1 and substrate 5 which is relatively moving in moving direction X.

During the coating process vacuum is created in the vicinity of the upstream edge of bead 4 by suctioning a gas from gas suction slot 3 which is provided upstream of feed slot 2 with respect to moving direction X, whereby the upstream edge of the bead is pulled toward the upstream of the moving direction. This prevents breakup of bead 4 caused by a shearing force that results from the relative movement of the substrate.

Suctioning the upstream edge of bead 4 toward the upstream of moving direction X, on the other hand, increases a risk of inflow of the coating solution of bead 4 into gas suction slot 3.

To solve this problem, in this embodiment, a gas is ejected from gas ejection slot 9 positioned between feed slot 2 and gas suction slot 3. The gas ejected from gas ejection slot 9 is, for example, air, nitrogen gas, or solvent vapor of the coating solution.

As illustrated FIG. 4B, the gas ejected from gas ejection slot 9 can prevent the upstream edge of bead 4 from approaching gas suction slot 3. This in turn prevents inflow of the coating solution forming bead 4 into gas suction slot 3.

Figure 4C:
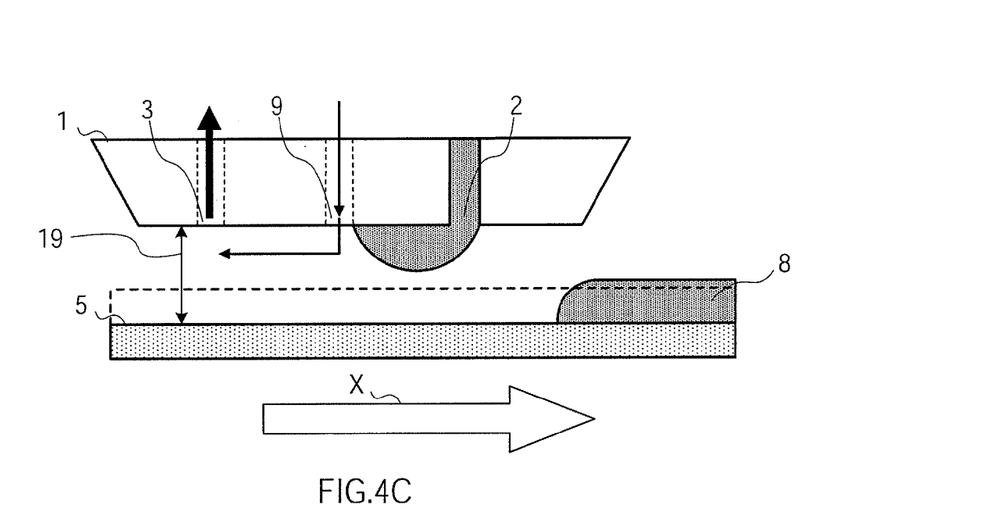

Even when bead 4 broke up due to extreme fluctuations in the size of coating gap 19 that resulted from breakage in substrate 5 as illustrated in FIG. 4C, the gas ejected from gas ejection slot 9 prevents inflow of the coating solution into gas suction slot 3.

In this way the liquid coater according to this embodiment can prevent unwanted inflow of coating solution into the gas suction slot, whereby the upstream edge of the bead can be suctioned by a strong force toward the upstream of the moving direction. This avoids breakup of bead 4 due to a shearing force that results from the relative movement of the substrate.

Furthermore, bead 4 is pressed against substrate 5 by the gas ejected from gas ejection slot 9. This enables bead 4 to be more stably retained even when the coating gap is widened. Thus, it is possible to increase the coating gap to, e.g., 10 to 20 times the thickness of the coating film to be deposited, preventing the die head and substrate from contacting each other.

Embodiment 2

A die head in which the ejection direction is made perpendicular to the substrate surface has been described in embodiment 1. Embodiment 2 describes a die head in which the ejection direction is made inclined with respect to the substrate surface toward the downstream of the moving direction.

Figure 5:
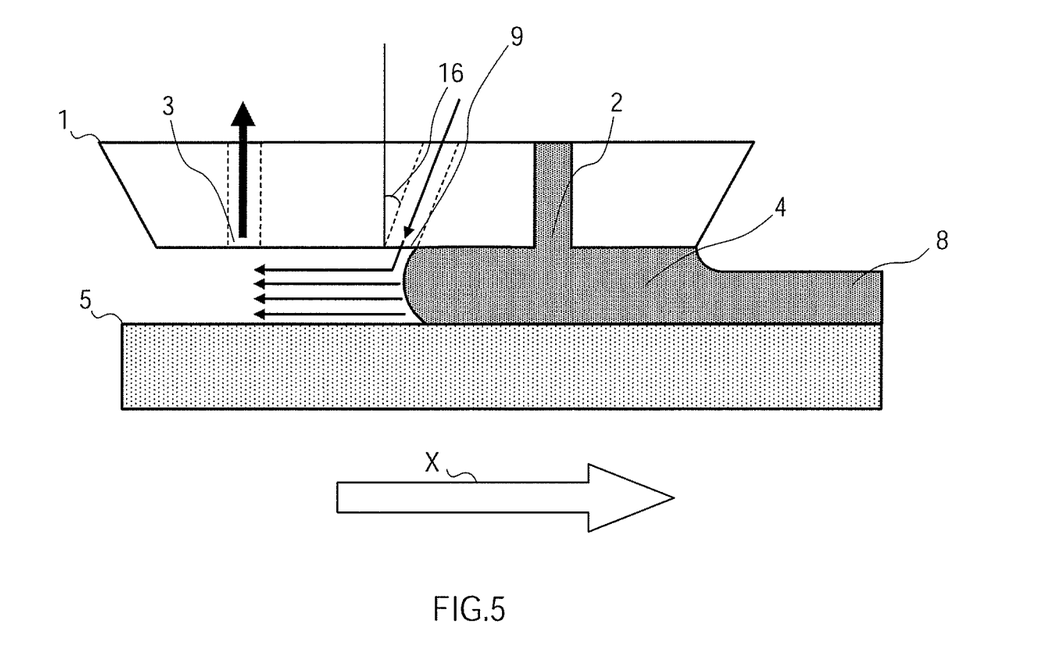
FIG. 5 is a cross-sectional view of a die head according to embodiment 2.

FIG. 5 is an enlarged view of a section of the tip portion of a die head according to embodiment 2 wherein the same components as those of the die head according to embodiment 1 are given the same corresponding reference numerals, and descriptions thereof are omitted herein. As illustrated in FIG. 5, in embodiment 2, the direction in which gas ejection slot 9 ejects a gas (ejection direction) is inclined with respect to the surface of substrate 5 toward the downstream of moving direction X.

More specifically, inclination angle 16 of the ejection direction with respect to the normal of the substrate surface is generally 1-75°.

By inclining the ejection direction with respect to the substrate surface toward the downstream of moving direction X in this way, it is possible not only to provide the effect described embodiment 1, but to prevent inflow the ejected gas between the bead and substrate. This prevents unstabilization of bead with reliability.

Figure 6:
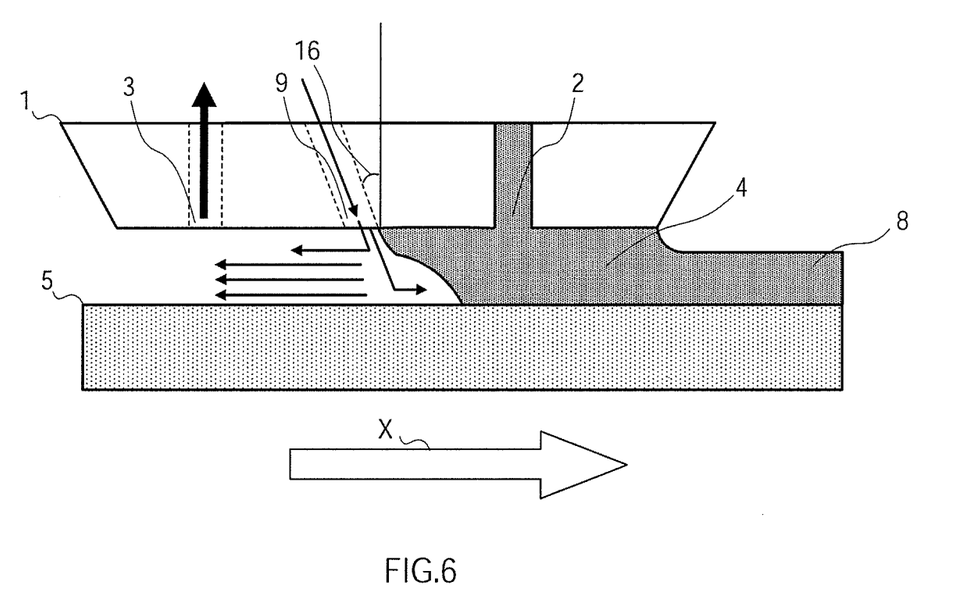
FIG. 6 is a cross-sectional view of a die head provided with a gas ejection slot inclined toward the upstream of the moving direction.

As described above, it is not preferable to incline the ejection direction with respect to the surface of substrate 5 toward the upstream of the moving direction X. As illustrated in FIG. 6, when the ejection direction is made inclined toward the upstream of the moving direction X, the gas ejected from gas ejection slot 9 flows between bead 4 and substrate 5 and makes bead 4 unstable (see Comparative Example 2).

Embodiment 3

Embodiment 3 describes a die head in which the tip portion surface has height differences.

Figure 7:
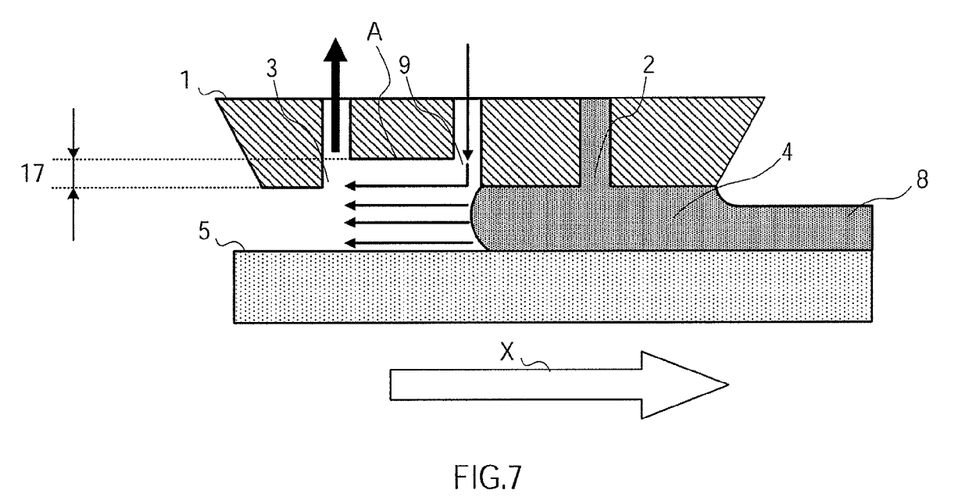
FIG. 7 is a cross-sectional view of a die head according to embodiment 3.

FIG. 7 is an enlarged view of a section of the tip portion of die head 1 according to embodiment 3 wherein the same components as those of the die head according to embodiment 1 are given the same corresponding reference numerals, and descriptions thereof are omitted herein. As illustrated in FIG. 7, in embodiment 3, the tip portion of die head 3 has level difference. More specifically, in the tip portion, region A between gas suction slot 3 and gas ejection slot 9 is smaller in height than the other regions. Height difference 17 between region A and the other regions of the tip portion is, for example, 50-300 μm. Thus, the gap between region A and substrate 5 is made wider than the gaps between the other regions and substrate 5.

By making the height of region A between gas suction slot 3 and gas ejection slot 9 smaller than the other regions of the tip portion surface in this way, it is possible not only to provide the effects described in embodiment 1, but to facilitate inflow of the gas ejected from gas ejection slot 9 into gas suction slot 3. This facilitates the gas ejected from gas ejection slot 9 to flow toward the upstream of moving direction X, preventing the gas from flowing between bead 4 and substrate 5 and thereby making bead 4 unstable.

Embodiment 4

In embodiments 1 to 3, die heads have been described in which the number of the gas suction slot is the same as the number of the gas ejection slot. Embodiment 4 describes a die head in which the number of the gas suction slot is larger than the number of the gas ejection slot.

Figure 8:
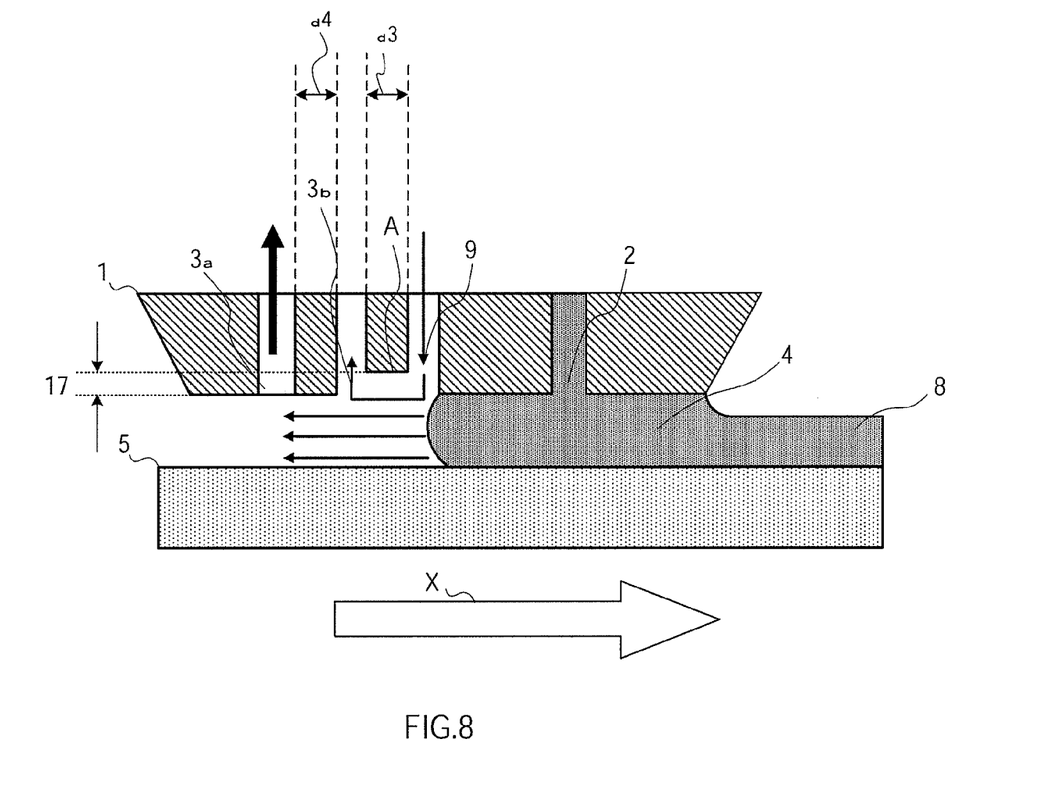
FIG. 8 is a cross-sectional view of a die head according to embodiment 4.
Figure 9A:
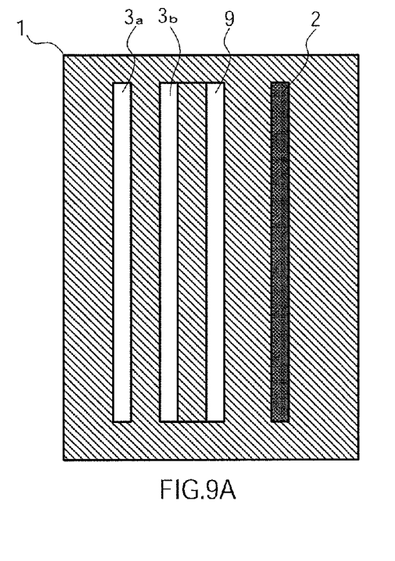
FIGS. 9A to 9D are plan views of a surface of the tip portion of a die head according to embodiment 4.
Figure 9B:
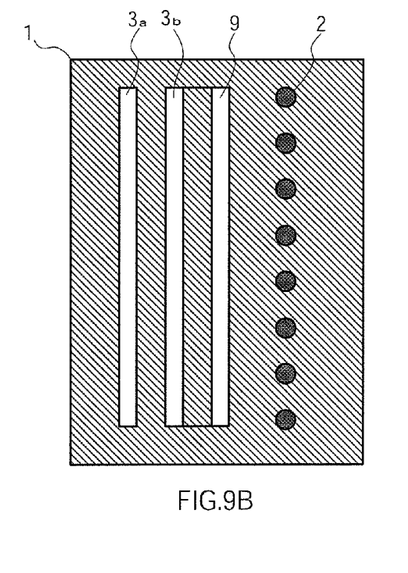
Figure 9C:
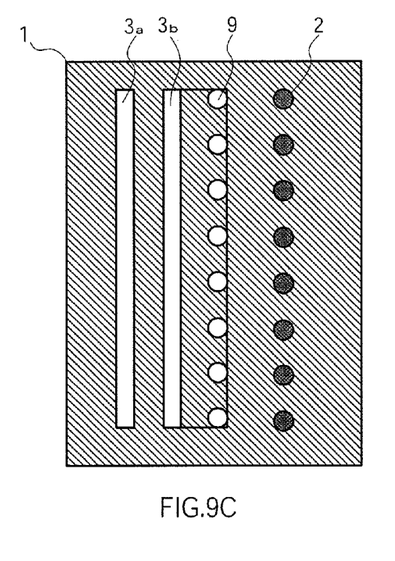
Figure 9D:
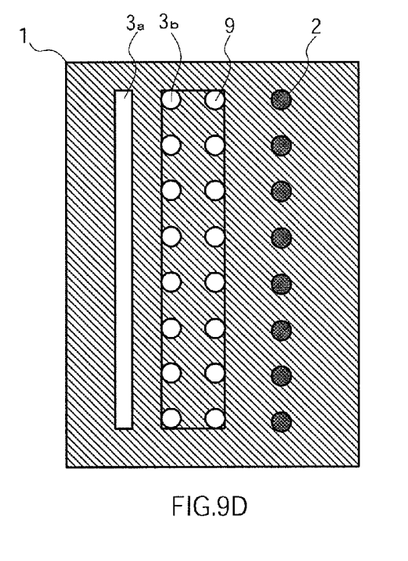
Figure 10A:
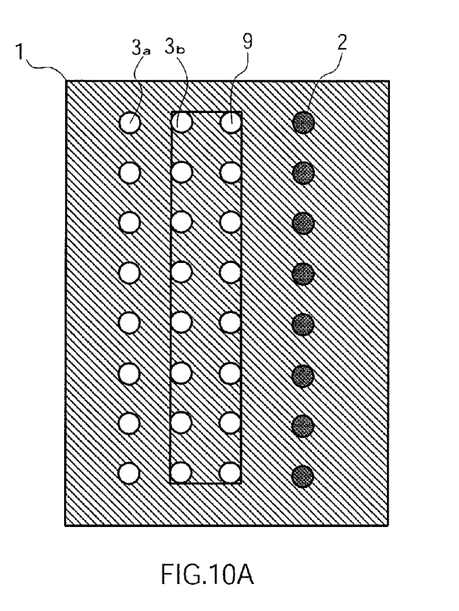
FIGS. 10A to 10C are plan views of a surface of the tip portion of a die head according to embodiment 4.
Figure 10B:
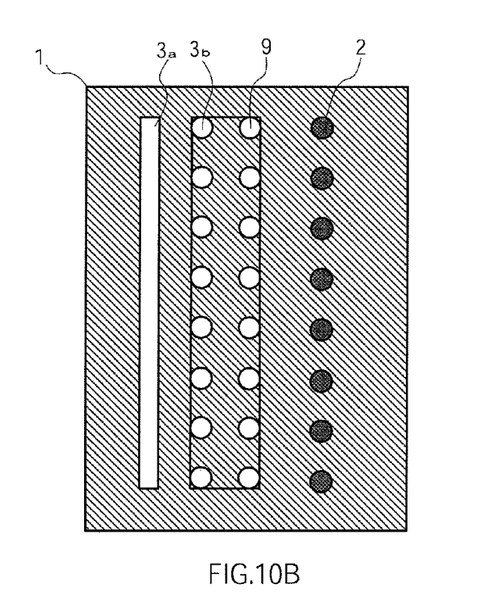
Figure 10C:
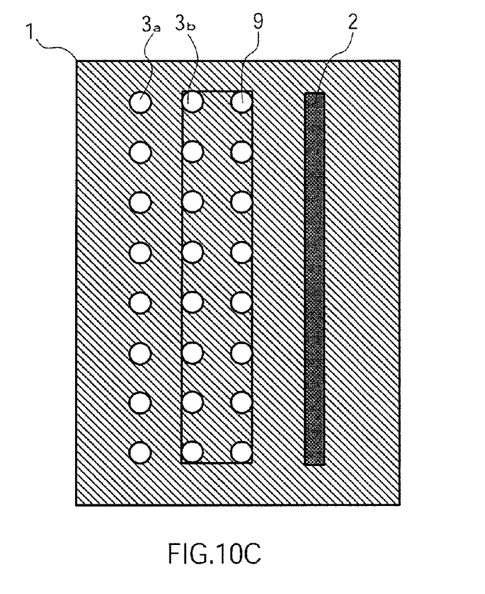

FIG. 8 is an enlarged view of a section of the tip portion of die head 1 according to embodiment 4 wherein the same components as those of the die head according to embodiment 1 are given the same corresponding reference numerals, and descriptions thereof are omitted herein. As illustrated in FIG. 8, in embodiment 4, the tip portion of die head 1 includes two gas suction slots (first and second gas suction slots 3a and 3b). Distance d3 between second gas suction slot 3b and gas ejection slot 9 is 0.03-19.64 mm, and distance d4 between first gas suction slot 3a and second gas suction slot 3b is 0.03-19.64 mm (see FIG. 8).

In embodiment 4, as illustrated in FIG. 8, in the tip portion region A between second gas suction slot 3b and gas ejection slot 9 is made smaller in height than the other regions of the tip portion.

First and second gas suction slots 3a and 3b both serve as a slot for suctioning a gas, but have different functions. For example, first gas suction slot 3a positioned upstream of moving direction X suctions a gas to pull the upstream edge of bead 4, whereas second gas suction slot 3b positioned downstream of moving direction X suctions a gas which has been ejected from gas ejection slot 9.

By providing additional second gas suction slot 3b which functions to recover the gas ejected from gas ejection slot 9 in this way, it is possible not only to provide the effects described in embodiment 1, but to prevent the gas ejected from gas ejection slot 9 from flowing between bead 4 and substrate 5 and making bead 4 unstable.

FIGS. 9A to 10C are plan views of a surface of the tip portion of die head 1 according to embodiment 4 as seen from the substrate 5 side. As illustrated in these drawings, each of the slots (feed slot, gas suction slot and gas ejection slot) may or may not be provided in the form of multiple holes so long as ejection of coating liquid, gas suctioning or gas ejection can be stably conducted.

EXAMPLES

Examples will be described below.

Example 1

In Example 1, glass substrates (substrates to be coated) were coated with a methylcellulose aqueous solution (coating solution) by use of the die head according to embodiment 1.

(Layout of Die Head)

The die head according to embodiment 1 illustrated in FIG. 3 was prepared, wherein the widths of feed slot 2, gas suction slot 3 and gas ejection slot 9 (widths 2d, 3d and 9d) were set to 100 μm, distance d1 between feed slot 2 and gas suction slot 3 was set to 2.05 mm, and distance d2 between feed slot 2 and gas ejection slot 9 was set to 1 mm. The ejection direction of the gas ejection slot was made perpendicular to the substrate surface. In Example 1, none of these slots were provided in the form of multiple holes (see FIG. 9A).

(Coating Condition)

A coating of methylcellulose aqueous solution (width: 30 cm, length: 100 cm, thickness: 10 μm) was formed on a glass substrate under the condition where the coating gap was 100 μm and relative moving speed of the glass substrate was 150 mm/s. The viscosity of the coating solution (methylcellulose aqueous solution) at a shearing rate of 1,000 (1/s) was set to 100 mPa·s.

The flow amount of a gas suctioned by the gas suction slot was set to 800 ml/min, and the flow amount of a gas (air) ejected from the gas ejection slot was set to 720 ml/min. Specifically, in Example 1, the net amount of gas to be suctioned (flow amount of gas to be suctioned minus flow amount of gas to be ejected) was set to 80 ml/min (800 ml/min-720 ml/min).

Under the above coating condition, 500 glass substrates were coated.

Example 2

In Example 2, glass substrates were coated with a methylcellulose aqueous solution by use of the die head according to embodiment 2 illustrated in FIG. 5. Specifically, in Example 2, glass substrates were coated under the same condition as that used in Example 1 except that the ejection direction was inclined toward the downstream of the moving direction.

In Example 2, inclination angle 16 of the ejection direction with respect to the normal of the substrate surface was set to 45° (see FIG. 5).

Example 3

In Example 3, glass substrates were coated under the same condition as that used in Example 2 except that inclination angle 16 of the ejection direction with respect to the normal of the substrate surface was set to 70° (see FIG. 5).

Comparative Example 1

In Comparative Example 1, 500 glass substrates were coated under the same condition as that used in Example 1 except that no gas ejection slot was provided in the die head and that the flow amount of a gas to be suctioned by the gas suction slot was set to 80 ml/min. Specifically, the die head prepared in Comparative Example 1 has the same structure as the conventional die head illustrated in FIG. 1A.

Comparative Example 2

In Comparative Example 2, glass substrates were coated under the same condition as that used in Example 1 except that the gas ejection slot was inclined toward the upstream of the moving direction. Specifically, the die head prepared in Comparative Example 2 has the same structure as the die head illustrated in FIG. 6. In Comparative Example 2, inclination angle 16 of the gas ejection slot with respect to the normal of the substrate surface was set to 45°.

(Result 1)

Table 1 shows the instances of discontinuity that occurred in the coatings being deposited in Examples 1 to 3 and Comparative Examples 1 and 2.

TABLE 1

Frequency of discontinuity

| | Number of coated substrates | | | | |
|---|---|---|---|---|---|
| | 1-100 | 101-200 | 201-300 | 301-400 | 401-500 |
| Example 1<br>Number of gas ejection slot: 1<br>Number of gas suction slot: 1<br>Inclination angle: 0 | 0 | 0 | 0 | 0 | 0 |
| Example 2<br>Number of gas ejection slot: 1<br>Number of gas suction slot: 1<br>Inclination angle: 45° toward downstream side | 0 | 0 | 0 | 0 | 0 |
| Example 3<br>Number of gas ejection slot: 1<br>Number of gas suction slot: 1<br>Inclination angle: 70° toward downstream side | 0 | 0 | 0 | 0 | 0 |
| Comparative Example 1<br>Number of gas ejection slot: 0<br>Number of gas suction slot: 1 | 0 | 0 | 1 | 2 | 4 |
| Comparative Example 2<br>Number of gas ejection slot: 1<br>Number of gas suction slot: 1<br>Inclination angle: 45° toward upstream side | 1 | 3 | 2 | 2 | 3 |

As seen from Table 1, in Examples 1 to 3, no coating discontinuity was observed in the coatings of the 500 glass substrates. In Comparative Example 1, coating discontinuity occurred 7 times in total. Thus, In Examples, no coating discontinuity occurred even through the upstream edge of the bead was suctioned by the same suction force as that employed in Comparative Examples (80 ml/min). These results suggest that the die head according to the present invention is capable of stable, high-precision coating compared to the conventional die heads.

In Comparative Example 2, where the gas ejection slot was inclined toward the upstream of the moving direction, coating discontinuity occurred 11 times in total. This is considered to be due to bead unstabilization triggered by the gas which was ejected from gas ejection slot 9 and flowed between the bead and substrate (see FIG. 6).

Example 4

In Example 4, glass substrates were coated under the same condition as that used in Example 1 except that the coating gap was set to 130 μm, that the flow amount of a gas to be suctioned by the gas suction slot was set to 900 ml/min, and that the flow amount of a gas to be ejected by the gas ejection slot was set to 810 ml/min. Specifically, in Example 4, the net amount of gas to be suctioned (flow amount of gas to be suctioned minus flow amount of gas to be ejected) was set to 90 ml/min (900 ml/min-810 ml/min).

The reason that the flow amount of a gas to be suctioned by the gas suction slot and the flow amount of a gas to be ejected by the gas ejection slot were set high in Example 4 compared to Example 1 is to stabilize the bead which would be otherwise unstable due to the widened coating gap.

Example 5

In Example 5, glass substrates were coated under the same condition as that used in Example 4 except that the die head according to embodiment 3 illustrated in FIG. 7 was used. Specifically, in Example 5, coating was conducted as in Example 4 except that in the tip portion of the die head the region between the gas ejection slot and gas suction slot was selectively made smaller in height.

More specifically, in the die head tip portion, region A between the gas ejection slot and gas suction slot was made smaller in height than the other regions by 50 μm (see FIG. 7).

Example 6

In Example 6, glass substrates were coated with methylcellulose aqueous solution under the same condition as that used in Example 4 except that the die head according to embodiment 4 illustrated in FIG. 8 was used.

Specifically, in Example 6, first and second suction slots 3a and 3b were provided in the tip portion of the die head. Moreover, region A between second gas suction slot 3b and gas ejection slot 9 was made smaller in height than the other regions by 50 μm (see FIG. 8).

Distance d3 between second gas suction slot 3b and gas ejection slot 9 was set to 1,000 μm, and distance d4 between first gas suction slot 3a and second gas suction slot 3b was set to 1,000 μm (see FIG. 8). The flow amount of gas to be suctioned by first gas suction slot 3a was set to 90 ml/min, and the flow amount of a gas to be suctioned by second gas suction slot 3b was set to 810 ml/min.

Comparative Example 3

In Comparative Example 3, glass substrates were coated under the same condition as that used in Example 4 except that no gas ejection slot was provided in the die head and that the flow amount of a gas to be suctioned by the gas suction slot was set to 90 ml/min.

(Result 2)

Table 2 shows the instances of discontinuity that occurred in the coatings being deposited in Examples 4 to 6 and Comparative Example 3.

TABLE 2

Frequency of discontinuity

| | Number of coated substrates | | | | |
|---|---|---|---|---|---|
| | 1-100 | 101-200 | 201-300 | 301-400 | 401-500 |
| Example 4<br>Number of gas ejection slot: 1<br>Number of gas suction slot: 1 | 0 | 0 | 1 | 1 | 0 |
| Example 5<br>Number of gas ejection slot: 1<br>Number of gas suction slot: 1<br>Height difference: 50 μm | 0 | 0 | 0 | 0 | 1 |
| Example 6<br>Number of gas ejection slot: 1<br>Number of gas suction slot: 2<br>Height difference: 50 μm | 0 | 0 | 0 | 0 | 0 |
| Comparative Example 3<br>Number of gas ejection slot: 0<br>Number of gas suction slot: 1 | 3 | 5 | 6 | 8 | 10 |

When the result of comparing Example 4 where the coating gap was set to 130 μm with the result of Example 1 where the coating gap was set to 100 μm (see Table 1), the instance coating discontinuity increased from 0 to 2 in Example 4. This result may be attributed to that fact that the bead became unstable as the coating gap widened. This would also be attributed to the fact that the ejected gas flowed between the bead and substrate and made the bead unstable, since the flow amount of the gas ejected in the gas ejection slot was large compared to that in Example 1.

In Example 5, on the other hand, the instance of coating discontinuity was reduced compared with Example 4. This may be due to the fact the height difference on the surface of the tip portion facilitated the gas, ejected from the gas ejection slot, to flow toward the upstream of the moving direction, thus preventing it from flowing toward the downstream of the moving direction.

In Example 6, it succeeded in completely avoiding coating discontinuity even in the case where the coating gap was 130 µm. This would be due to the fact that the additional second gas suction slot suctioned the gas ejected from the gas ejection slot so as to prevent it from flowing toward the downstream of the moving direction.

The above results suggest that the present invention is capable of rapid, stable and high-precision coating.

INDUSTRIAL APPLICABILITY

The present invention is capable of rapid, stable and high-precision coating, and therefore can be applied to manufacturing processes of devices that require printing of functional layers of high flatness, such as organic EL displays, plasma displays, liquid crystal displays, solar cells, and lithium secondary batteries.

REFERENCE SIGNS LIST

1 . . . Die head
2 . . . Feed slot
3 . . . Gas suction slot
4 . . . Bead
5 . . . Substrate to be coated
6 . . . vicinity of the upstream edge of bead
8 . . . Coating
9 . . . Gas ejection slot
10 . . . Compressor
11 . . . Vacuum pump
12 . . . Flow control valve
13 . . . Flow meter
14 . . . Feed pump
15 . . . Coating solution tank
16 . . . Inclination angle of gas ejection slot
17 . . . Height difference on die head tip surface
18 . . . Manifold
19 . . . Coating gap

The invention claimed is:

1. A die head for forming a coating film, the die head comprising a tip portion for continuously discharging a coating solution to form the coating film on a substrate and configured to retain a bead of the coating solution in a gap formed between the substrate and the tip portion during a relative movement of the substrate with respect to the die head in a predetermined moving direction, wherein the tip portion comprises:
a feed slot which is positioned at a downstream side of the tip portion in the moving direction of the substrate and continuously feeds the coating solution;
a gas suction slot which is positioned at an upstream side of the tip portion in the moving direction of the substrate and suctions a gas so as to create a vacuum in a vicinity of an upstream edge of the bead with respect to the moving direction of the substrate; and
a gas ejection slot which is positioned between the feed slot and the gas suction slot and ejects a gas toward the upstream edge of the bead positioned on an upstream side from an aperture of the feed slot so as to prevent an inflow of the coating solution into the gas suction slot, wherein
a direction in which the gas ejection slot ejects the gas is one of a perpendicular direction with respect to a surface of the substrate or an inclined direction with respect to the surface of the substrate toward the upstream side of the tip portion in the moving direction of the substrate, and
an aperture plane of the feed slot, an aperture plane of the gas ejection slot, an aperture plane of the gas suction slot, a plane of the tip portion between the aperture plane of the gas ejection slot and the aperture plane of the gas suction slot, and a plane of the tip portion between the aperture plane of the feed slot and an aperture plane of the gas ejection slot are arranged on a same plane.

2. The die head according to claim 1, wherein a distance between the feed slot and the gas ejection slot is at least 0.3 mm, and a distance between the gas ejection slot and the gas suction slot is between 0.05 mm and 15 mm.

3. The die head according to claim 1, wherein the gas ejection slot ejects the gas in the perpendicular direction with respect to the surface of the substrate.

4. The die head according to claim 1, wherein the gas ejection slot ejects the gas in the inclined direction with respect to the surface of the substrate toward the upstream side of the tip portion in the moving direction of the substrate.

5. The die head according to claim 4, wherein an inclination angle of the inclined direction in which the gas ejection slot ejects the gas with respect to a normal of the substrate surface is between 1° and 75°.

6. A liquid coater comprising the die head according to claim 1.

* * * * *